United States Patent
De Bosscher

(10) Patent No.: US 8,043,488 B2
(45) Date of Patent: Oct. 25, 2011

(54) ROTATABLE SPUTTER TARGET

(75) Inventor: Wilmert De Bosscher, Drongen (BE)

(73) Assignee: Bekaert Advanced Coatings, Deinze (BE)

( * ) Notice: Subject to any disclaimer, the term of this patent is extended or adjusted under 35 U.S.C. 154(b) by 557 days.

(21) Appl. No.: 12/302,203

(22) PCT Filed: May 31, 2007

(86) PCT No.: PCT/EP2007/055281
§ 371 (c)(1),
(2), (4) Date: Nov. 24, 2008

(87) PCT Pub. No.: WO2007/141174
PCT Pub. Date: Dec. 13, 2007

(65) Prior Publication Data
US 2009/0139862 A1    Jun. 4, 2009

(30) Foreign Application Priority Data
Jun. 2, 2006 (EP) .................................. 06114890

(51) Int. Cl.
*C23C 14/34* (2006.01)
*H01J 37/34* (2006.01)
(52) U.S. Cl. ......... 204/298.21; 204/192.15; 204/192.23; 204/298.13; 204/298.16; 204/298.22; 204/298.28

(58) Field of Classification Search ............. 204/192.15, 204/192.23, 298.13, 298.16, 298.21, 298.22, 204/298.28
See application file for complete search history.

(56) References Cited

U.S. PATENT DOCUMENTS

| 5,427,665 A | 6/1995 | Hartig et al. |
| 5,470,452 A | 11/1995 | Dickey et al. |
| 5,725,746 A | 3/1998 | Dickey et al. |

FOREIGN PATENT DOCUMENTS
EP    0 586 809 B1    3/1994

*Primary Examiner* — Christopher Young
(74) *Attorney, Agent, or Firm* — Foley & Lardner LLP

(57) ABSTRACT

The invention relates to a rotatable sputter target and to a method to manufacture such a sputter target. The sputter target comprises a target material and a magnet array located at the interior of the target material. The magnet array defines a central zone extending along the major part of the length of the target material and defines an end zone at each end of the central zone. The target material comprises a first material and a second material. The target material comprises the first material at least on the central zone and comprises the second material at least on the end zones. The second material has a lower sputter deposition rate than the first material. The second material is preferably applied by thermal spraying. The first material comprises a first element and the second material comprises a compound of the first element of the first material.

35 Claims, 1 Drawing Sheet

ROTATABLE SPUTTER TARGET

FIELD OF THE INVENTION

The invention relates to an improved rotatable sputter target and to a method of manufacturing such a sputter target.

BACKGROUND OF THE INVENTION

Over the last decades, magnetron sputtering has become a well-known technique to deposit thin coatings such as metal coatings or ceramic coatings on large area substrates such as glass or elongated flexible substrates.

The technique of sputtering is typically used to deposit silicon oxide, silicon nitride, titanium oxide, zinc oxide, tin oxide, . . . .

The sputter deposition rate and the degree of target consumption are important issues to make the sputter process economically interesting.

By the introduction of the rotatable sputter target, the sputter process became more attractive as several advantages can be realized. The most important advantages are the higher target material consumption, the possibility to use a higher power density and thus to obtain a higher sputter deposition rate, the enhanced anode functionality during AC sputtering and the drastically reduced arc sensitivity during reactive sputtering.

However, while realizing a number of advantages, the rotatable sputter target also shows problems.

Reactive sputtering involves working and controlling the sputter deposition rate of a metal in a reactive gas as known from the hysteresis curve.

High sputter deposition rates are obtained in the metallic mode.

However, as the reactive gas may interact with the target material, an insulating material can be built up at all exposed a non-sputtering surfaces.

To obtain higher sputter deposition rates, one has developed systems with fast feedback loops to sustain the target in a metastable semi-poisoned state. While monitoring sensitive signals of the process (e.g. partial pressure, target voltage, optical emission of the plasma, . . . ) one can feedback any drift from the unstable situation to maintain the semi-poisoned target state.

Although the consumption of a rotatable target is significantly higher compared to planar targets, still a considerable amount of target material is lost by the setup of the sputter target and the magnet array and the consumption of the target material of a rotatable target remains an issue.

During operation, the rotatable sputter target rotates below the stationary race track. At the race track turns a higher power density and thus a higher sputter deposition is obtained, leading to a higher consumption of the target material. Once all the available target material is consumed at the race track turns, the target has to be replaced although still an appreciable amount of valuable material may be present over the main part of the target.

To overcome these problems, it is known in the art to apply more material at the ends of the sputter target. The sputter targets obtained in this way are called dog-bone targets.

However, material brittleness and manufacturing problems limit the extent to which the dog-bone solution can be used.

Although the above-mentioned problems could be solved by using an adequate feedback loop system and by using targets having a dog-bone structure, new problems arise. The target consumption drops for example to values typically known for planar targets.

U.S. Pat. Nos. 5,470,452 and 5,725,746 disclose rotatable targets comprising an elongated tubular member having a target material at the outer surface thereof. The target comprises a collar of an electrically conductive material at least one end of the tubular member. The target material is substantially free of the collar material. The collar material suppresses arcing. However, this type of rotatable targets shows a number of drawbacks.

As the thermal contact between the collar and the target material is not optimal, thermal stresses in the collar material can be high.

The collar will be thermally expanded to a higher extent compared to the rest of the target material. Consequently, the thermal contact between the collar and the water cooled target material will be further reduced. Finally, during sputtering the collar will function as a loose glowing ring over the rotating target material and may cause local melt zones on the target material.

A further drawback of this type of rotatable targets is that material sputtered from the collar material will be deposited also on the edges of the substrate being coated where it will be mixed with material sputtered from the target.

SUMMARY OF THE INVENTION

It is an object of the present invention to provide a rotatable sputter target avoiding the problems of the prior art.

It is another object of the present invention to provide a rotatable sputter target having an optimized target consumption.

It is a further object of the invention to provide a rotatable sputter target whereby substantially the whole length of the target material is used in the sputtering process.

It is another object of the invention to provide a method of manufacturing a rotatable sputter target.

According to a first aspect of the invention a rotatable sputter target is provided.

The rotatable sputter target comprises a target material and a magnet array located at the interior of said target material. The magnet array defines a central zone extending along the major part of the length of the target material and defines end zones at each end of the central zone.

The target material comprising a first material and a second material.

The target material second material has a lower sputter deposition rate than the first material. The target material comprises the first material at least at the central zone and comprises the second material at least at the end zones.

The first material comprises a first element and the second material comprises a compound of the first element of the first material.

In a preferred embodiment, the first material is applied on the central zone and on the end zones, whereas the second material is applied at least on the end zones on top of the first material.

Preferably, the coating sputter deposited from the first material and from the second material have substantially the same composition. With "substantially the same composition" is meant that at least 80% of the atomic composition of the coating sputter deposited from the first and from the second material is the same.

The term "substantially the same composition" is further illustrated by an example.

Material X and material Y having the following composition
material X containing 40 at % of a, 30 at % of b, 20 at % of c and 10 at % of d (no e);

material Y containing 35 at % of a, 40 at % of b, 15 at % of c and 10 at % of e (no d);
are considered as having substantially the same composition as 80% of the atomic composition is the same.

As the first and the second material are used to deposit a coating a substrate having substantially the same composition, substantially the whole length of the target metal is used for sputtering.

With "substantially the whole length of the target material" is meant the central zone and the end zones.

The fact that substantially the whole length of the target material is used for sputtering is a great advantage of a rotatable sputter target according to the present invention compared to sputter targets known in the art.

In principle, the first material may comprise any material that can be used in DC or in midfrequent AC sputtering.

As mentioned above, the first material comprises at least a first element.

Preferably, the first element comprises a metal and more preferably, the first element comprises a metal selected from the group consisting of Zn, Sn, Ag, Cu, Nd, Ni, Zr, Fe, Al, Si, Ti, Nb, Ta, Cr, Mo and W.

The first material may comprise a compound or an alloy of the first element.

The first material may also comprise the first element doped with another element.

Furthermore, the first material may comprise a compound of the first element doped with another element or an alloy of the first element doped with another element.

As mentioned above, the second material comprises preferably a compound of the first element of the material.

For the purpose of the present invention a compound of the first element of the first material is defined as any material comprising the first element.

The second material may for example consist of the first element of the first material.

Alternatively, the second material may comprise an alloy of the first element of the first material.

Furthermore, the second material may comprise a chemical compound of the first element of the first material such as an oxide, a nitride or an oxynitride of the first element of the first material.

In another embodiment, the second material comprises the first element of the first material doped with at least one element other than the first element or comprises a compound of the first element of the first material doped with at least one element other than the first element.

The rotatable sputter target according to the present invention is in particular suitable to be used in a reactive sputter process using a reactive gas.

In a preferred embodiment, the first material comprises a metal and the second material chemical compound of this metal and of the reactive gas.

Preferred embodiments of rotatable targets according to the present invention comprise
  a rotatable target having a target material comprising Zn as first material and ZnO2 as second material. The rotatable target is preferably used in a reactive sputter process using oxygen as reactive gas;
  a rotatable target having Ti as first material and $TiO_xN_y$ (with $0 \leq x \leq 2$, $0 \leq y \leq 2$ and at least one of x or y different from 0) as second material. The rotatatable target is preferably used in a reactive sputter process using oxygen or nitrogen or a combination of oxygen and nitrogen as reactive gas;
  a rotatable target having a target material comprising Si:Al (with 10 wt % Al) as first material and Si as second material. The rotatable target can be used in a reactive sputter process using any kind of reactive gas. Preferably, the reactive gas comprises oxygen or nitrogen.

The target material can be self-supporting or can be deposited on a target base.

Possibly, and adhesion promoting layer can be applied on the target base before the application of the target material.

The first material and the second material of the target material can be obtained by any technique known in the art, as for example by casting, extrusion, sintering, hipping and spraying, such as thermal spraying or by any combination thereof.

The second material is preferably obtained by thermal spraying.

As the second material is applied by thermal spraying, a diffusion layer will be created at the interface of the first and the second material.

This diffusion layer guarantees an excellent thermal conductivity between the first and the second material.

By the presence of the diffusion layer, the second material is anchored in the first material and will not become loose during the use of the sputter target.

This is a great advantage compared to sputter targets known in the art.

In a preferred embodiment of the present invention, both the first material and the second material are obtained by thermal spraying.

A first group of sputter targets according to the present invention comprises sputter targets having a uniform thickness of the target material over the entire length of the target base.

The thickness of the target material is preferably ranging between 2 and 30 mm an more preferably between 4 and 15 mm.

A second group of sputter targets according to the present invention comprises sputter targets whereby the target material has a dog-bone structure.

For a target material having a dog-bone structure the thickness of the target material at the end zones is higher than the thickness of the target material located at the central zone.

In case the target material has a dog-bone structure the thickness of the target material at the central zone is preferably ranging between 2 and 20 mm and the thickness of the target material at the end zones is preferably ranging between 3 and 30 mm.

According to a second aspect of the present invention, a method to manufacture a rotatable sputter target is provided.

The method comprises the steps of
  providing a target material comprising a first and a second material, said second material having a lower sputter deposition rate than said first material; and
  providing a magnet array being located at the interior of the target material. The magnet array defines a central zone extending along the major part of the length of the target material and defines end zones at each end of the central zone;

The target material comprises the first material at least on the central zone and comprises the second material at least on the end zones.

The first material comprises a first element and the second material comprises a compound of the first element of the first material.

In a preferred method the target material comprises the first material on the central zone and on the end zones and the second material on the end zones on top of the first material.

The first and the second material are preferably obtained by casting, extrusion, sintering, hipping or spraying.

More preferably the second material is obtained by thermal spraying.

BRIEF DESCRIPTION OF THE DRAWINGS

The invention will now be described into more detail with reference to the accompanying drawings wherein.

DESCRIPTION OF THE PREFERRED EMBODIMENTS OF THE INVENTION

Figure 1:
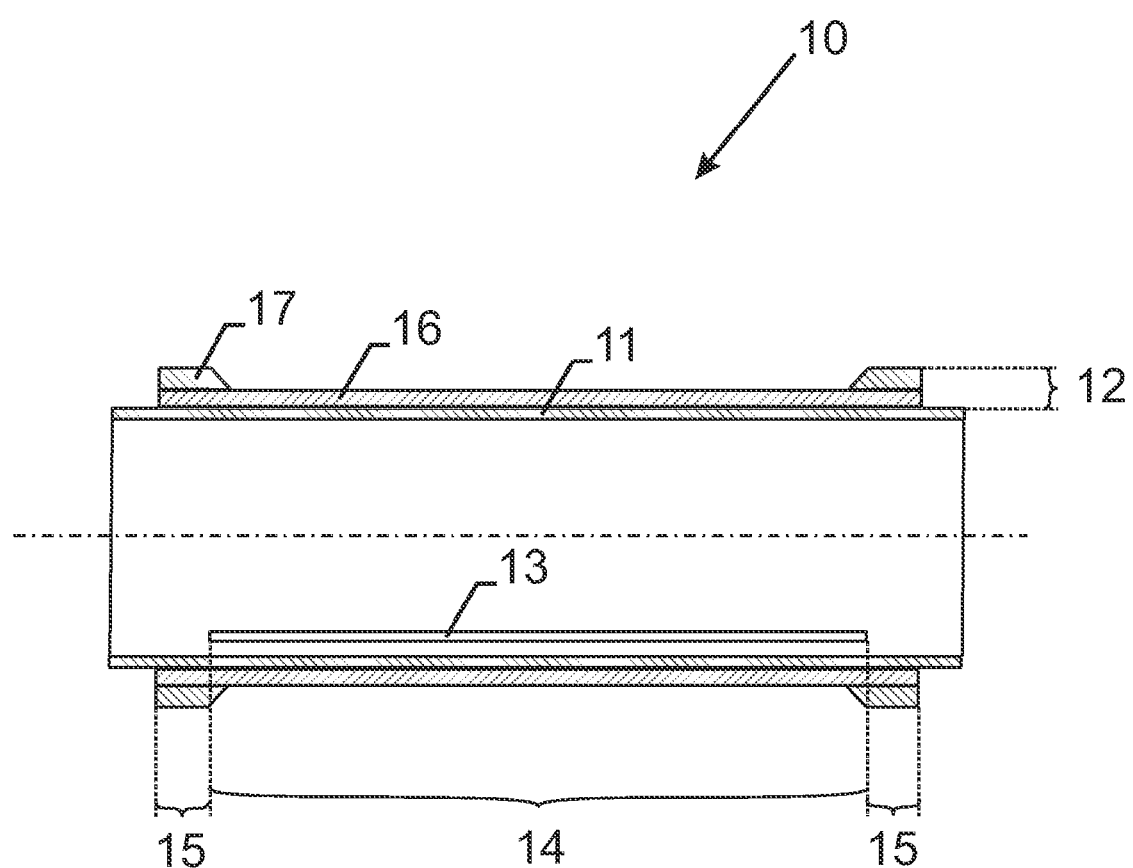
FIG. 1 is a schematic view of a rotatable sputter target according to the present invention.

In a first test a rotatable metallic titanium target known from the prior art is used to deposit a titanium dioxide coating.

The target has a straight structure and is provided with an adequate feedback loop system. The target consumption is limited to 15-45%.

Although applicant does not want to be bound to any theory, it seems that the following may be happening:

The feedback loop system is monitoring a specific fast reaction process variable at one or more locations across the length of the target.

With the appropriate feedback parameter, the target surface is kept in its semi-poisoned state. However, at the same time, the race track turn is situated in a different poisoning condition.

For the purpose of this invention, "race track turn" is defined as the area having a higher plasma density or a longer residence time in the plasma region than the central target region (sputtering zone).

Since more plasma density or a longer plasma exposure is leading to more surface cleaning (i.e. oxygen removal and revealing fresh titanium) and is leading to a surface condition that can be compared to having less oxygen.

Consequently, at the race track turns less oxidized or contaminated titanium is sputtered at a high sputter deposition rate whereas at the center of the sputter target more poisoned titanium or titanium (sub)oxide is sputtered at a lower sputter deposition rate.

The sputter deposition rate is thus higher at the race track turns because the longer plasma residence and because a different material is sputtered with a higher sputter deposition rate.

Both effects cause a much higher deposition rate in the race track turns and as a consequence lead to an overall target consumption drop to values typically known for planar targets.

FIG. 1 shows a rotatable target 10 according to the present invention. The rotatable target 10 comprises a target base 11, a target material 12 applied at the outer side of the target base and a magnet array 13 located within said target base. The magnet array 13 defines a central zone 14 and two end zones 15. The central zone 14 is extending along the major part of the length of the target base 11. The end of the central zone is roughly corresponding with the end of magnet array 13.

The target material 12 comprises a first material 16 and a second material 17.

The first material 16 is applied at least on the central zone 14, the second material 17 is applied at least on the end zones 15. The second material has a lower sputter deposition rate than the first material.

The first material comprises Ti and the second material comprises $TiO_x$ with $0 \leq x \leq 2$. $TiO_x$ is applied by thermal spraying.

The rotatable target 10 is being used in a reactive process and is provided with an adequate feedback system.

The second material 17 located at the end zones 15 will sputter with a deposition rate similar to the deposition rate of the first material 16 located at the central zone 14.

The second material 17 of the end zones 15 will also from a $TiO_2$ layer of good quality because the depleted amount from the gas (due to extra erosion) is compensated by the presence of oxygen of the second material 17.

The invention claimed is:

1. A rotatable sputter target comprising a target material and a magnet array located at the interior of said target material, said magnet array defining a central zone extending along the major part of the length of said target material and defining end zones at each end of said central zone, said target material comprising a first material and a second material, said second material having a lower sputter deposition rate than said first material, said target material comprising said first material at least at said central zone and said second material at least at said end zones, wherein said first material comprises a first element and said second material comprises a compound of said first element of said first material.

2. A rotatable target according to claim 1, whereby said first material is applied on said central zone and on said end zones and said second material is applied at least on said end zones on top of said first material.

3. A sputter target according to claim 1, whereby the coating sputter deposited from said first material and from said second material have substantially the same composition.

4. A sputter target according to claim 1, whereby said first element of said first material comprises a metal.

5. A sputter target according to claim 4, whereby said metal is selected from the group consisting of Zn, Sn, Ag, Cu, Nd, Ni, Zr, Fe, Al, Si, Ti, Nb, Ta, Cr, Mo and W.

6. A sputter target according to claim 1, whereby said second material consists of said first element of said first material.

7. A sputter target according to claim 1, whereby said second material comprises an alloy of said first element of said first material.

8. A sputter target according to claim 1, whereby said second material comprises a chemical compound of said first element of said first material.

9. A sputter target according to claim 1, whereby said second material comprises said first element of said first material doped with at least one element other than said first element or comprises a compound of said first element of said first material doped with at least one element other than said first element.

10. A sputter target according to claim 1, whereby said sputter target is used in a reactive sputter process using a reactive gas.

11. A sputter target according to claim 1, whereby said first material comprises a metal and said second material comprises a chemical compound of said metal and of reactive gas.

12. A sputter target according to claim 1, whereby said target material is self-supporting.

13. A sputter target according to claim 1, whereby said target material is deposited on a target base.

14. A sputter target according to claim 1, whereby said first material and said second material is obtained by casting, extrusion, sintering, hipping or spraying.

15. A sputter target according to claim 1, whereby said second material is obtained by thermal spraying.

16. A sputter target according to claim 1, whereby a diffusion layer is created between said first and said second material.

17. A sputter target according to claim 1, whereby said target material has a uniform thickness over its whole length.

18. A sputter target according to claim 1, whereby said target material has a dog-bone structure whereby the thickness of said target material is thicker at said end zones.

19. A method to manufacture a sputter target as defined in claim 1, said method comprising the steps of
providing a target material comprising a first and a second material, said second material having a lower sputter deposition rate than said first material; and
providing a magnet array being located at the interior of said target material, said magnet array defining a central zone extending along the major part of the length of said target material and defining end zones at each end of said central zone;
said target material comprising said first material at least on said central zone and comprising said second material at least on said end zones, wherein said first material comprises a first element and said second material comprises a compound of said first element.

20. A method according to claim 19, whereby said first material is applied on said central zone and on said end zones and said second material is applied at least on said end zones on top of said first material.

21. A method according to claim 19, whereby said element of said first material comprises a metal.

22. A method according to claim 21, whereby said metal is selected from the group consisting of Zn, Sn, Ag, Cu, Nd, Ni, Zr, Fe, Al, Si, Ti, Nb, Ta, Cr, Mo and W.

23. A method according to claim 19, whereby said second material consists of said first element of said first material.

24. A method according to claim 19, whereby said second material comprises an alloy of said first element of said first material.

25. A method according to claim 19, whereby said second material comprises a chemical compound of said first element of said first material.

26. A method according to claims 19, whereby said second material comprises said first element of said first material doped with at least one element other than said first element or comprises a compound of said first element of said first material doped with at least one element other than said first element.

27. A method according to claim 19, whereby said sputter target is used in a reactive sputter process using a reactive gas.

28. A method according to claim 19, whereby said first material comprises a metal and said second material comprises a chemical compound of said metal and of reactive gas.

29. A method according to claim 19, whereby said target material is self-supporting.

30. A method according to claim 19, whereby said target material is deposited on a target base.

31. A method according to claim 19, whereby said first material and said second material are obtained by casting, extrusion, sintering, hipping or spraying.

32. A method according to claim 19, whereby said second material is obtained by thermal spraying.

33. A method according to claim 19, whereby a diffusion layer is between said first and said second material.

34. A method according to claim 19, whereby said target material has a uniform thickness over its whole length.

35. A method according to claim 19, whereby said target material has a dog-bone structure whereby the thickness of said target material is thicker at said end zones.

* * * * *